(12) United States Patent
Guterman et al.

(10) Patent No.: US 7,468,915 B2
(45) Date of Patent: Dec. 23, 2008

(54) METHOD OF REDUCING DISTURBS IN NON-VOLATILE MEMORY

(75) Inventors: Daniel C. Guterman, Fremont, CA (US); George Samachisa, San Jose, CA (US); Brian Murphy, San Jose, CA (US); Chi-Ming Wang, Fremont, CA (US); Khandker N. Quader, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/538,521

(22) Filed: Oct. 4, 2006

(65) Prior Publication Data

US 2007/0076510 A1   Apr. 5, 2007

Related U.S. Application Data

(60) Continuation of application No. 11/238,911, filed on Sep. 28, 2005, now Pat. No. 7,145,804, which is a continuation of application No. 11/054,084, filed on Feb. 8, 2005, now Pat. No. 6,977,844, which is a division of application No. 10/613,098, filed on Jul. 1, 2003, now Pat. No. 6,888,752, which is a division of application No. 09/759,835, filed on Jan. 10, 2001, now Pat. No. 6,717,851, which is a continuation-in-part of application No. 09/703,083, filed on Oct. 31, 2000, now Pat. No. 6,570,785.

(51) Int. Cl.
   *G11C 11/34* (2006.01)
(52) U.S. Cl. ............................ 365/185.23; 365/230.06
(58) Field of Classification Search ............ 365/185.09, 365/185.23, 185.18, 185.11, 185.12, 230.06, 365/189.09
See application file for complete search history.

(56) References Cited

U.S. PATENT DOCUMENTS 5,095,344 A   3/1992   Harari (Continued)

FOREIGN PATENT DOCUMENTS

| EP | 0 459 633 A2 | 4/1991 |
| EP | 0 899 744 A1 | 3/1999 |
| JP | 09-106688 | 4/1997 |

OTHER PUBLICATIONS

PCT Search Report dated Jul. 9, 2003.

(Continued)

*Primary Examiner*—Anh Phung
(74) *Attorney, Agent, or Firm*—Davis Wright Tremaine LLP

(57) ABSTRACT

In a non-volatile memory, the displacement current generated in non-selected word lines that results when the voltage levels on an array's bit lines are changed can result in disturbs. Techniques for reducing these currents are presented. In a first aspect, the number of cells being simultaneously programmed on a word line is reduced. In a non-volatile memory where an array of memory cells is composed of a number of units, and the units are combined into planes that share common word lines, the simultaneous programming of units within the same plane is avoided. Multiple units may be programmed in parallel, but these are arranged to be in separate planes. This is done by selecting the number of units to be programmed in parallel and their order such that all the units programmed together are from distinct planes, by comparing the units to be programmed to see if any are from the same plane, or a combination of these. In a second, complementary aspect, the rate at which the voltage levels on the bit lines are changed is adjustable. By monitoring the frequency of disturbs, or based upon the device's application, the rate at which the bit line drivers change the bit line voltage can be adjusted. This can be implemented by setting the rate externally, or by the controller based upon device performance and the amount of data error being generated.

7 Claims, 9 Drawing Sheets

U.S. PATENT DOCUMENTS

| | | | |
|---|---|---|---|
| 5,172,338 A | 12/1992 | Mehrotra et al. | |
| 5,172,338 A | 12/1992 | Mehrotra et al. | |
| 5,371,705 A * | 12/1994 | Nakayama et al. | 365/185.23 |
| 5,396,468 A | 3/1995 | Harari et al. | |
| 5,418,752 A | 5/1995 | Harari et al. | |
| 5,532,962 A | 7/1996 | Auclair et al. | |
| 5,598,370 A | 1/1997 | Niijima et al. | |
| 5,663,923 A | 9/1997 | Baltar et al. | |
| 5,818,753 A | 10/1998 | Gotou | |
| 5,890,192 A | 3/1999 | Lee et al. | |
| 5,995,414 A | 11/1999 | Sato | |
| 6,061,270 A | 5/2000 | Choi | |
| 6,069,039 A | 5/2000 | Lee et al. | |
| 6,151,255 A * | 11/2000 | Joo et al. | 365/185.29 |
| 6,157,983 A | 12/2000 | Lee et al. | |
| 6,236,593 B1 | 5/2001 | Hong et al. | |
| 6,314,025 B1 | 11/2001 | Wong | |
| 6,597,609 B2 * | 7/2003 | Chevallier | 365/201 |
| 6,762,970 B2 * | 7/2004 | Joo | 365/230.06 |
| 6,836,436 B2 * | 12/2004 | O | 365/185.3 |

OTHER PUBLICATIONS

Notification of Reasons for Refusal, Japanese Patent Application No. 2002-558274 for SanDisk Corporation, May 7, 2006, 8 pages.
Notification of Reasons for Refusal, Japanese Patent Application No. 2002-558274 for SanDisk Corporation, Dec. 5, 2006, 7 pages.
Office Action for Korean Patent Application No. 2003-7006026 mailed Sep. 9, 2008, 1 page.

* cited by examiner

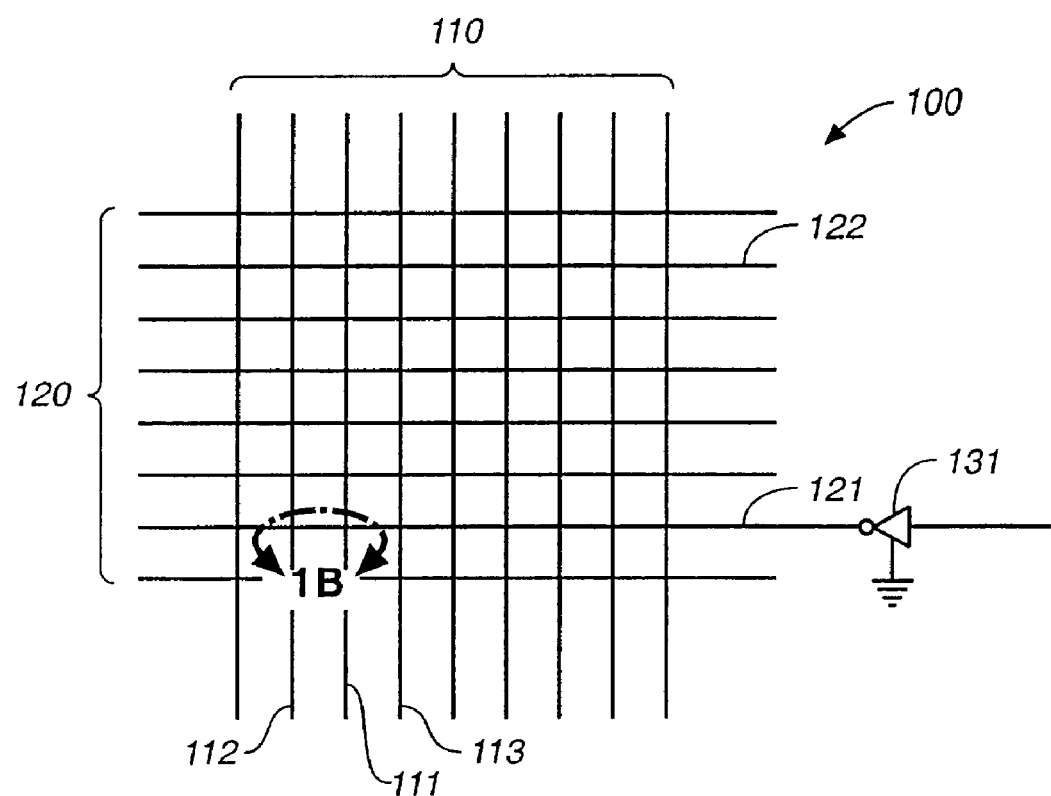
FIG._1A
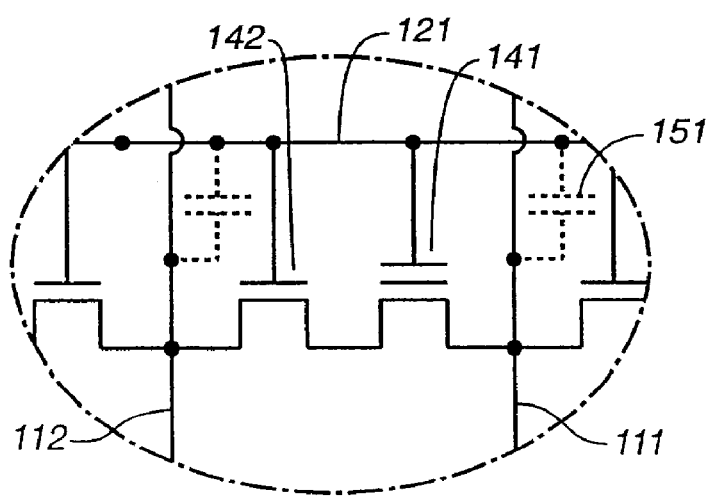
FIG._1B

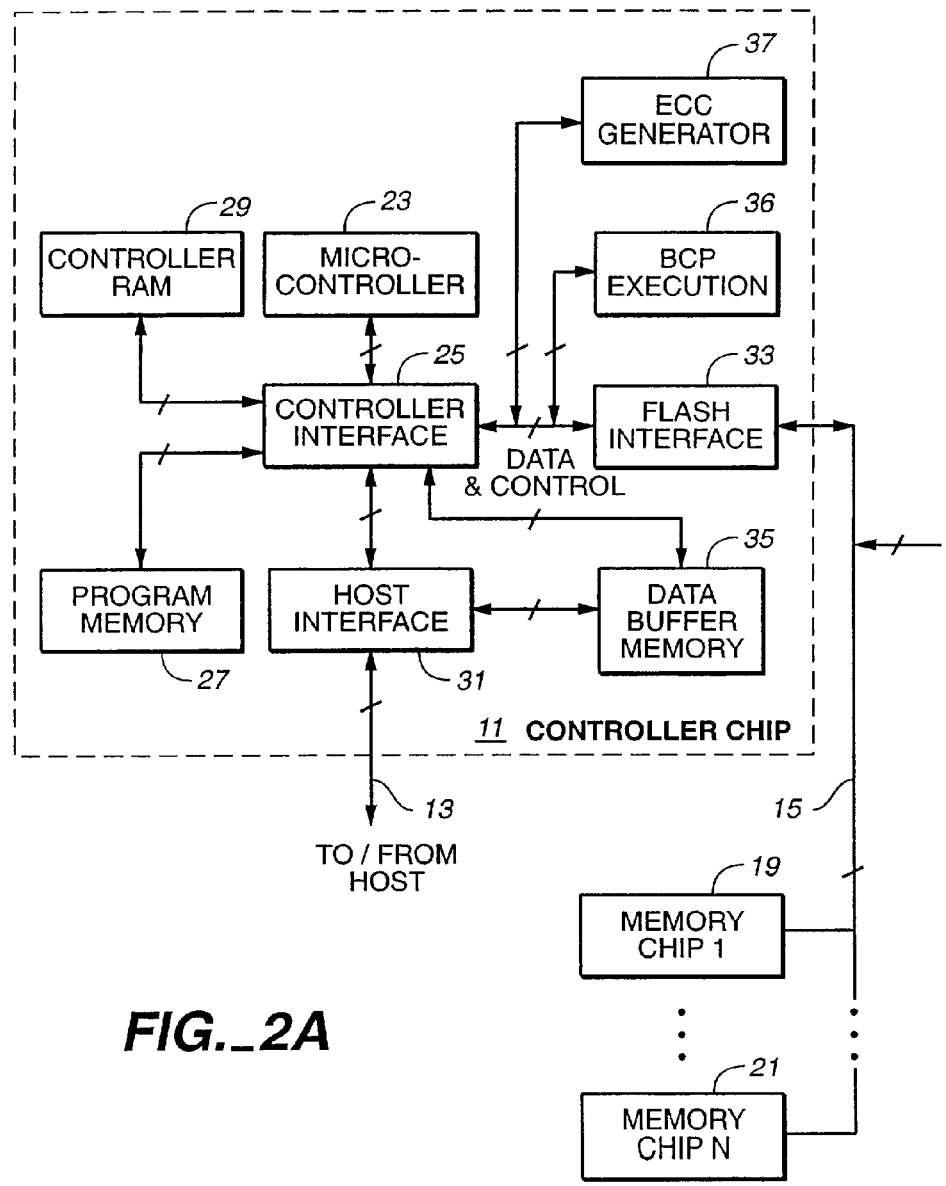
FIG._2A
FIG._2A | FIG._2B
FIG._2

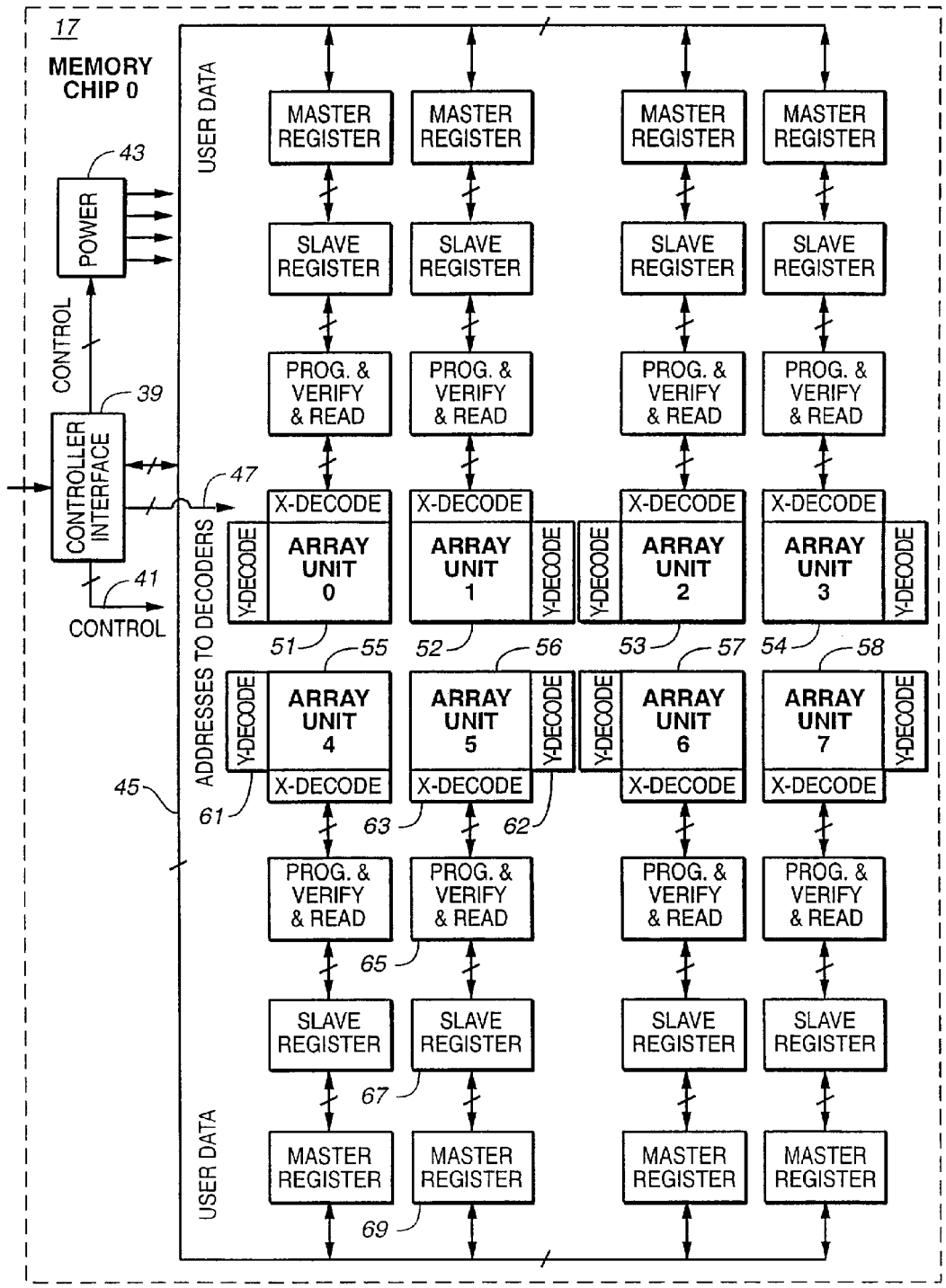
FIG._2B

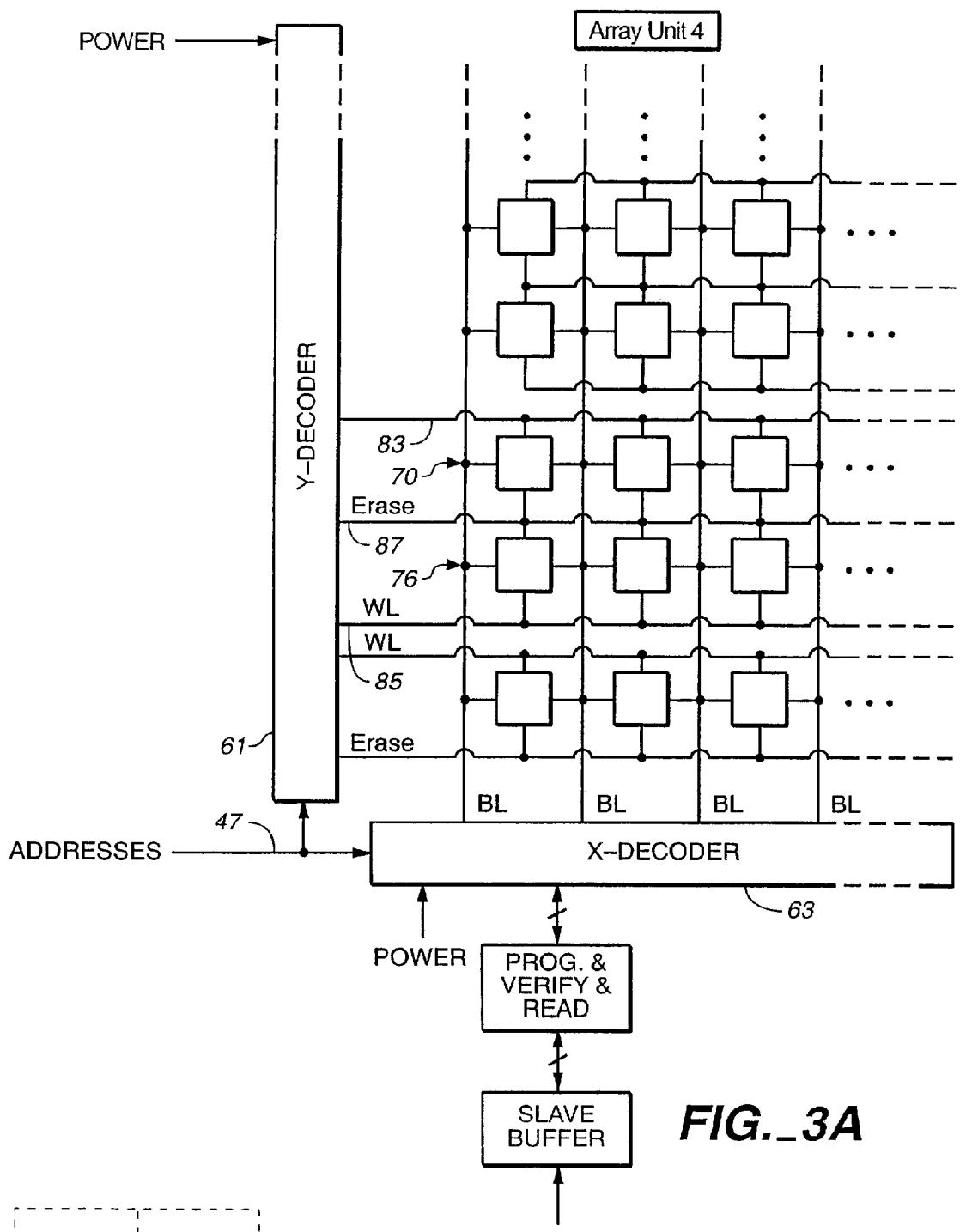
FIG._3A
FIG._3

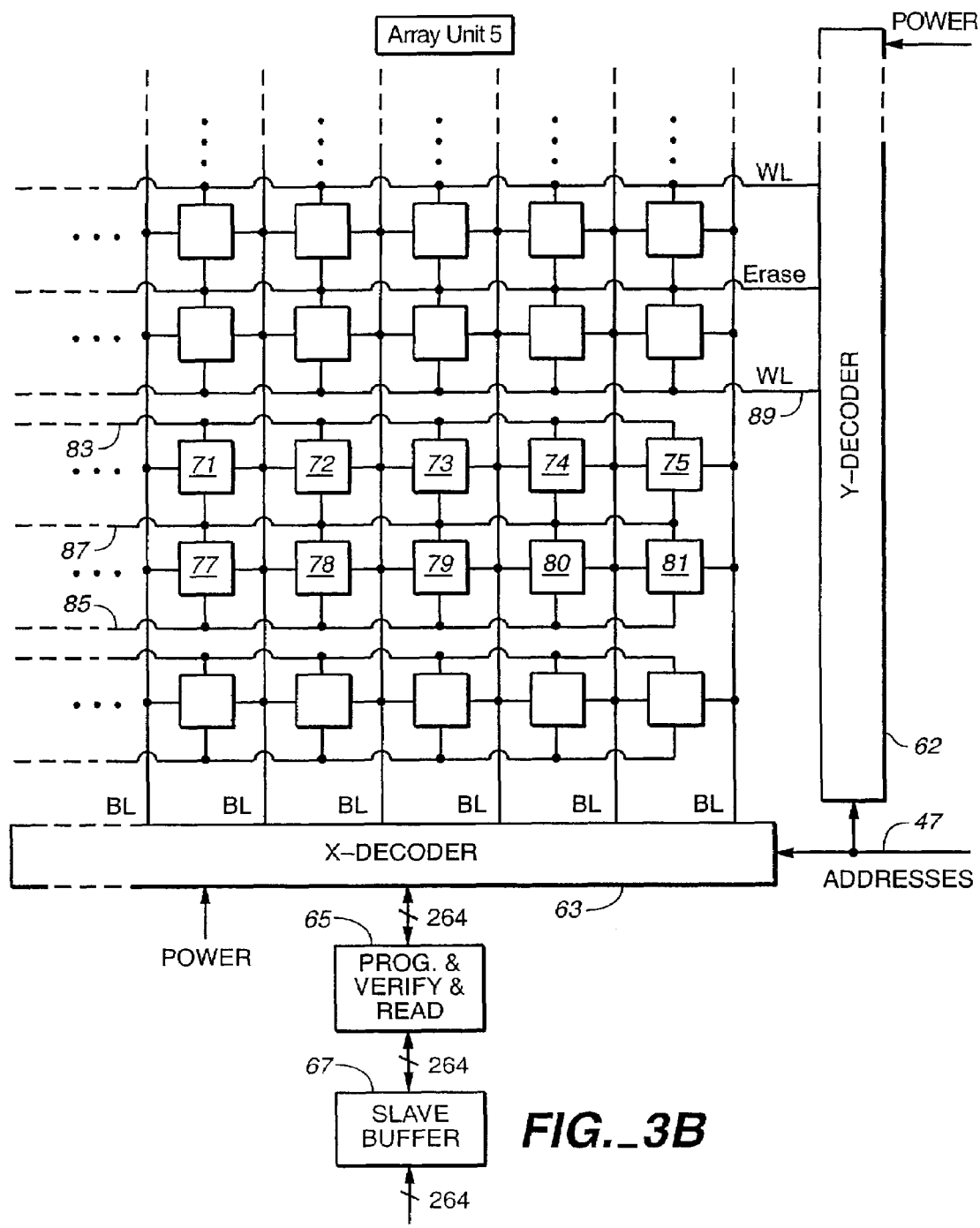
FIG._3B

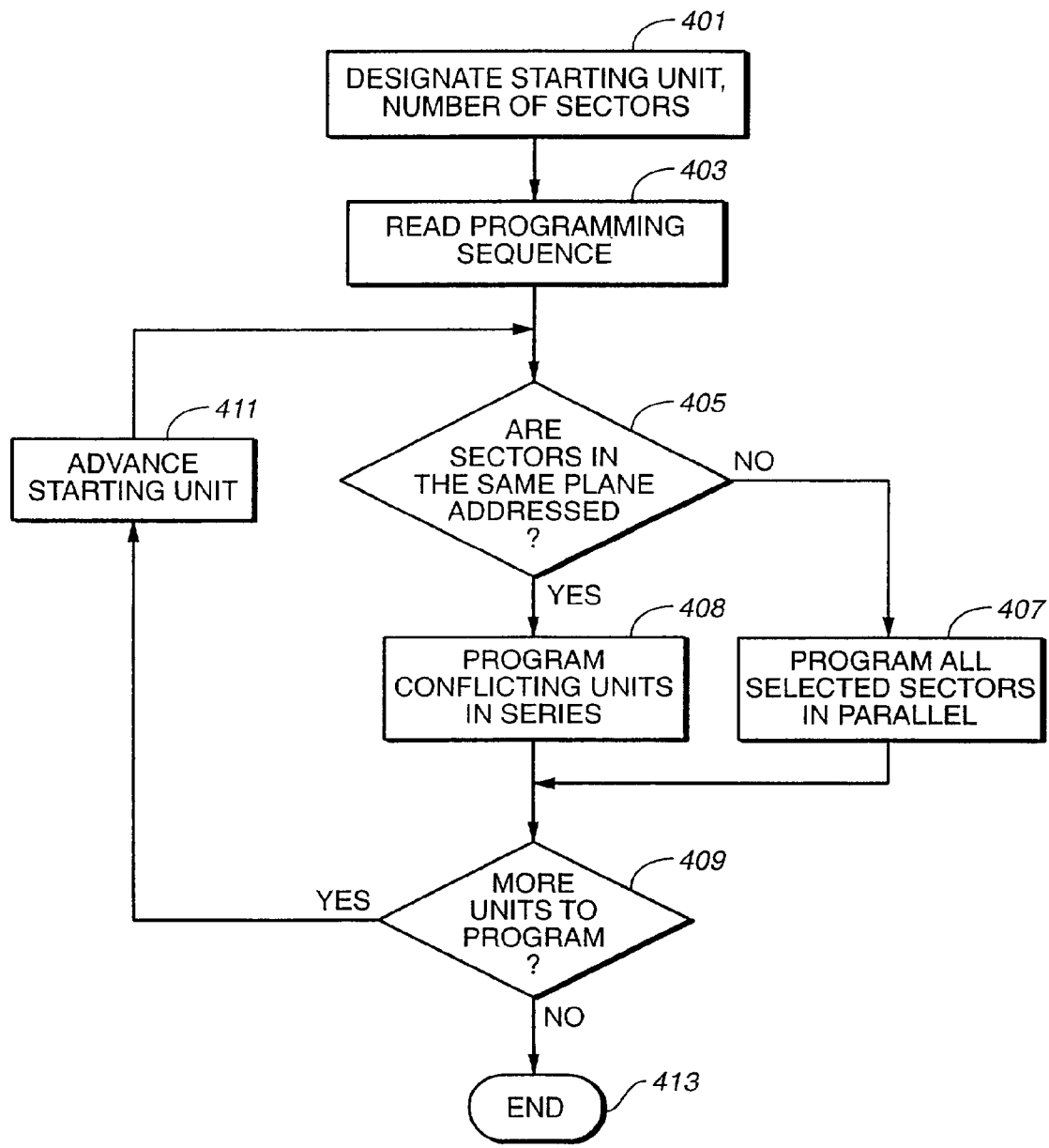
FIG._4

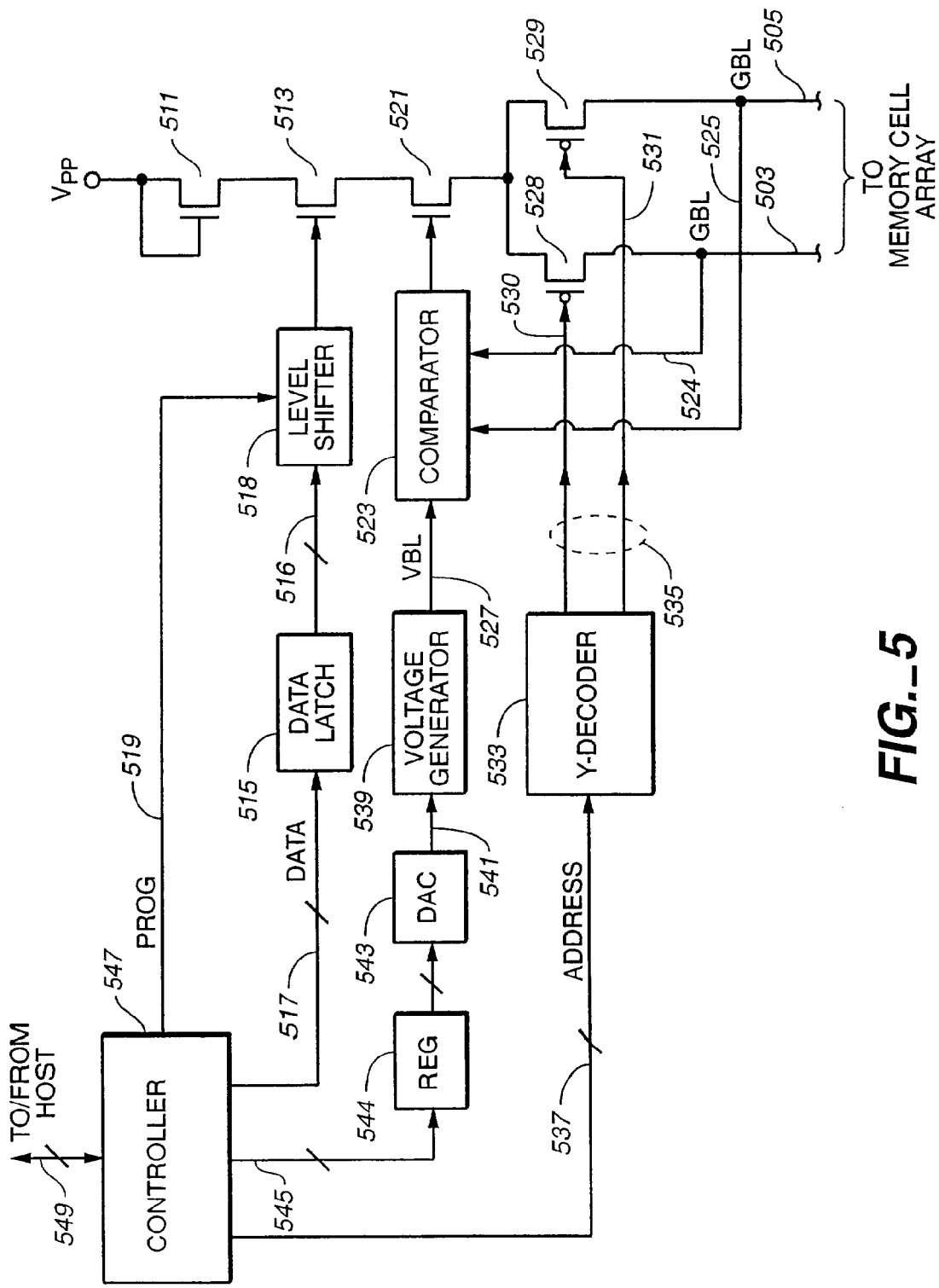
FIG._5

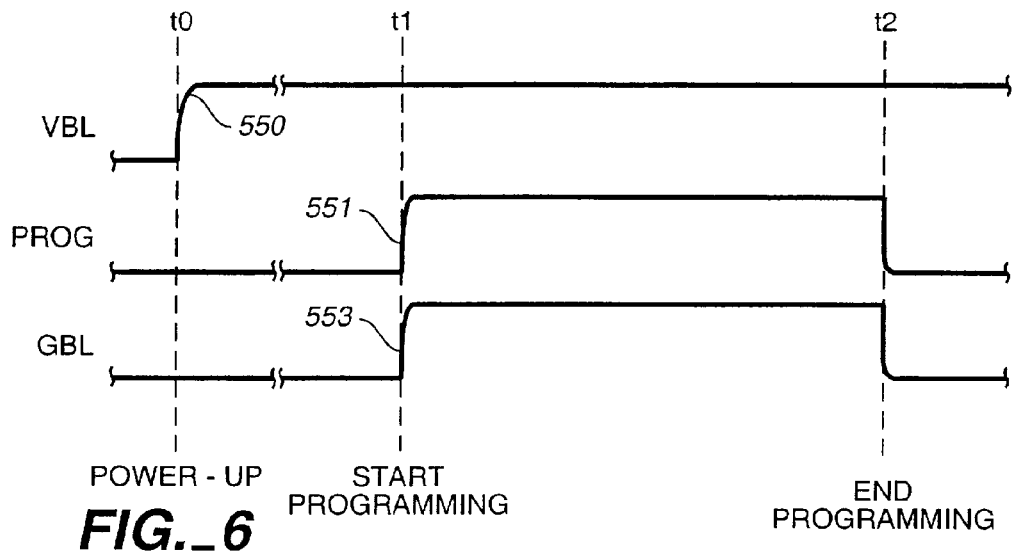
FIG._6
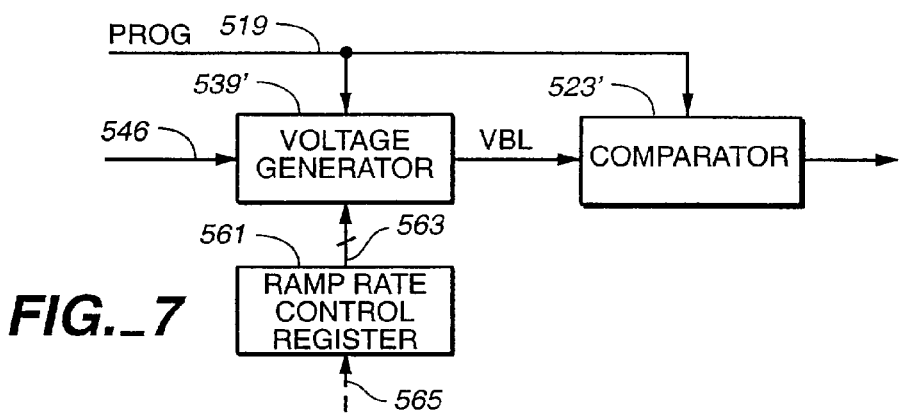
FIG._7
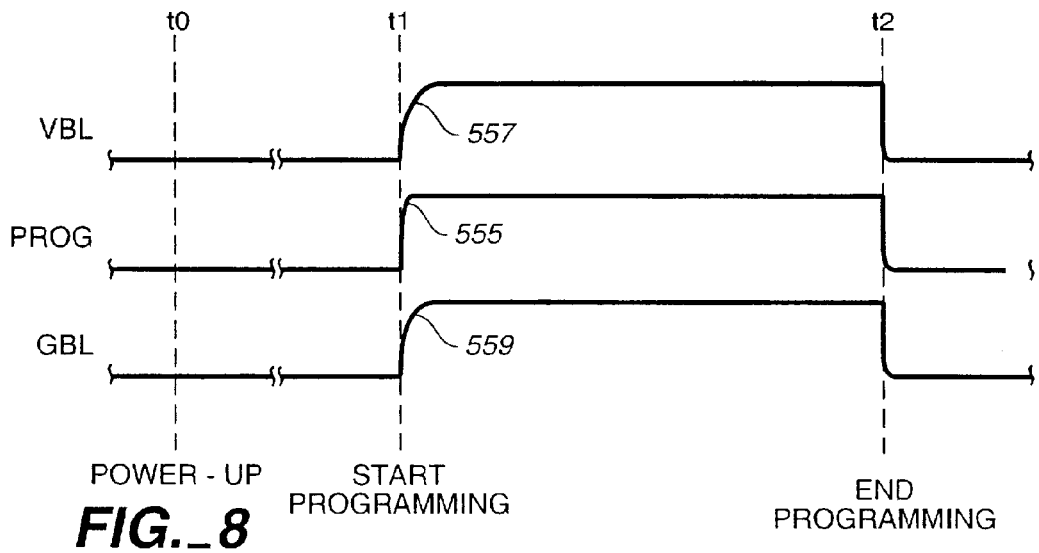
FIG._8

METHOD OF REDUCING DISTURBS IN NON-VOLATILE MEMORY

CROSS-REFERENCE TO RELATED APPLICATION

This is a continuation of patent application Ser. No. 11/238,911, filed Sep. 28, 2005, now U.S. Pat. No. 7,145,804, issued on Dec. 5, 2006, which is a continuation of patent application Ser. No. 11/054,084, filed Feb. 8, 2005, which is a division of 10/613,098, filed Jul. 1, 2003, which is in turn a division of patent application Ser. No. 09/759,835, filed Jan. 10, 2001, now U.S. Pat. No. 6,717,851 which is a continuation-in-part of patent application Ser. No. 09/703,083, filed Oct. 31, 2000, now U.S. Pat. No. 6,570,785, all of which applications are incorporated herein by this reference.

BACKGROUND OF THE INVENTION

1. Field of the Invention

This invention relates generally to non-volatile memories, and, more specifically, to methods of reducing disturbs in electrically erasable and programmable read only memories (EEPROMs).

2. Background Information

A non-volatile memory cell stores information by altering the control gate voltage required to enable source-drain current conduction. This is known as the cell's threshold voltage, Vt. Programming is the operation used to change this conduction threshold in order to store information on the cell. The memory cells are conventionally arranged in an array, with rows defined by word lines, columns defined by bit lines, and the cells identified by the word lines and bit lines to which they are attached.

A portion of such an array of memory cells is shown schematically in FIG. 1. In this figure, the word lines 120 and bit lines 110 form a grid. The detail shows an example of how a cell may be place within this array. In this particular example, the cell is taken to consist of a pair of transistors, the select transistor 142 and the floating gate transistor 141 on which the information is stored through alteration of its threshold voltage, which both have their control gates connected to the word line 121. This example also shows a virtual-ground architecture where the adjoining cells sharing bit lines, with the cell composed of transistors 141 and 142 connected between bit lines 111 and 112. A number of other cells, structures, and architectures can be used for the array. These are discussed more fully in U.S. Pat. Nos. 5,172,338 and 5,095,344, both of which are assigned to SanDisk Corporation, and both of which are hereby incorporated herein by this reference.

As with most devices, EEPROMs and Flash EEPROMs are susceptible to defects and failures. One way errors can occur is by the shifting of the threshold level of the memory states. This shifting is partly due to ambient conditions, but more often due to stress from normal operations of the memory device, such as erase, program or read. These errors, and methods for dealing with them, are discussed in more fully in U.S. Pat. Nos. 5,418,752 and 5,532,962, both of which are assigned to SanDisk Corporation and both of which are hereby incorporated herein by this reference, and also in U.S. Pat. Nos. 5,172,338 and 5,095,344, which were incorporated by reference above.

One mechanism that affects the threshold values of the memory cells is a "program disturb". When the memory array is a two dimensional matrix as in FIG. 1, each bit line, such as 111, of the set of bit lines 110 runs through all of the word lines 120. To program a cell, a voltage is applied across the cell's drain and source through the bit lines. At the same time, the cell must be also be activated by a voltage to its control gate. For example, the column containing the cell is enabled by having its source bit line raised to a high voltage of, say, 6-8 volts relative to its drain bit line. The cell to be programmed is then addressed by applying pulses of, say, 10-12 volts to its word line. Other cells within the same column are not addressed since their word lines are non-selected and placed at zero potential; nevertheless, they may be affected by the program operation of the addressed cell because of the high voltage on the common bit line and the other bit lines as well. This may induce electric charge leakage in these non-addressed cells, resulting in either a gain or loss of electric charge in their floating gate depending on the electrical mechanism.

The patents above include a number of techniques for treating such errors, such as the use of error correcting code (ECC) and a refresh, or "scrubbing", operation. However, the number or severity of the errors can become sufficient to overwhelm these methods and result in a degradation of the data stored in the memory. Therefore, it is preferable to reduce both the number and severity of such disturbs.

SUMMARY OF THE INVENTION

It has been found that a source of disturbs is the displacement current generated in non-selected word lines of an array that results when the voltage levels on array's bit lines are changed. Due to the capacitive coupling between the word lines and the bit lines, each of the bit lines crossing a word line contributes an amount proportional to the rate at which the voltage level on the bit line is changed. As the memory array circuit is scaled downward in size, the degree of coupling increases. Because of the non-perfect conductivity of the word lines, it has been found, this induced current results in a voltage developed on the control gates of memory cells along the non-selected word lines and, consequently, may result in disturbs.

In a first aspect of the present invention, the number of cells being simultaneously programmed on a word line is reduced. In a non-volatile memory where an array of memory cells is composed of a number of units, and the units are combined into planes that share common word lines, the simultaneous programming of units within the same plane is avoided. Multiple units may be programmed in parallel, but these are arranged to be in separate planes. This can be done by selecting the number and order of units to be programmed in parallel such that only units from distinct planes are programmed together. Alternately, or additionally, the units to be programmed can be compared to see if any are from the same plane and writing those units that are in the same plane sequentially.

In a second aspect of the present invention, the rate at which the voltage levels in the bit lines are changed is controlled through control of the operation of the bit line drivers. A reduction in the rise time of the voltages impressed on the bit lines reduces the amount of current induced in the word lines the bit lines cross. This rate of change may be made to be adjustable, such as a single time by the manufacturer, externally by the user whenever desired or automatically within the memory system to adapt to changing operating conditions. By monitoring the frequency of disturbs through the amount of data error being generated, or based upon the device's application, as examples, the rate at which the bit line drivers change the bit line voltage may be adjusted either automatically by the controller or by the user.

Either of the first or second aspects described above can be used alone, or the two can be used together in a complementary manner, to reduce displacement current generated in non-selected word lines. A major advantage is the control, if not a substantial elimination, of a source of disturbs of data stored in memory cells along the non-selected rows.

Additional aspects, features and advantages of the present invention are included in the following description of specific representative embodiments, which description should be taken in conjunction with the accompanying drawings.

BRIEF DESCRIPTION OF THE DRAWINGS

FIG. 1 shows an array of memory cells schematically;

FIG. 2 is a block schematic diagram of an example non-volatile memory system in which various aspects of the present invention may be implemented;

FIG. 3 is a more detailed schematic diagram of one of the memory cell array units, with associated logic and buffers, of the system of FIG. 2;

FIG. 4 is simplified flow chart for one aspect of the present invention;

FIG. 5 is a schematic diagram of bit line voltage driver and selection circuits;

FIG. 6 is a timing diagram showing the operation of the circuits of FIG. 5;

FIG. 7 is a block diagram showing a modification of the circuits of FIG. 5;

FIG. 8 a timing diagram showing operation of the circuits of FIG. 5, as modified by those of FIG. 7.

DESCRIPTION OF REPRESENTATIVE EMBODIMENTS

Figure 9:
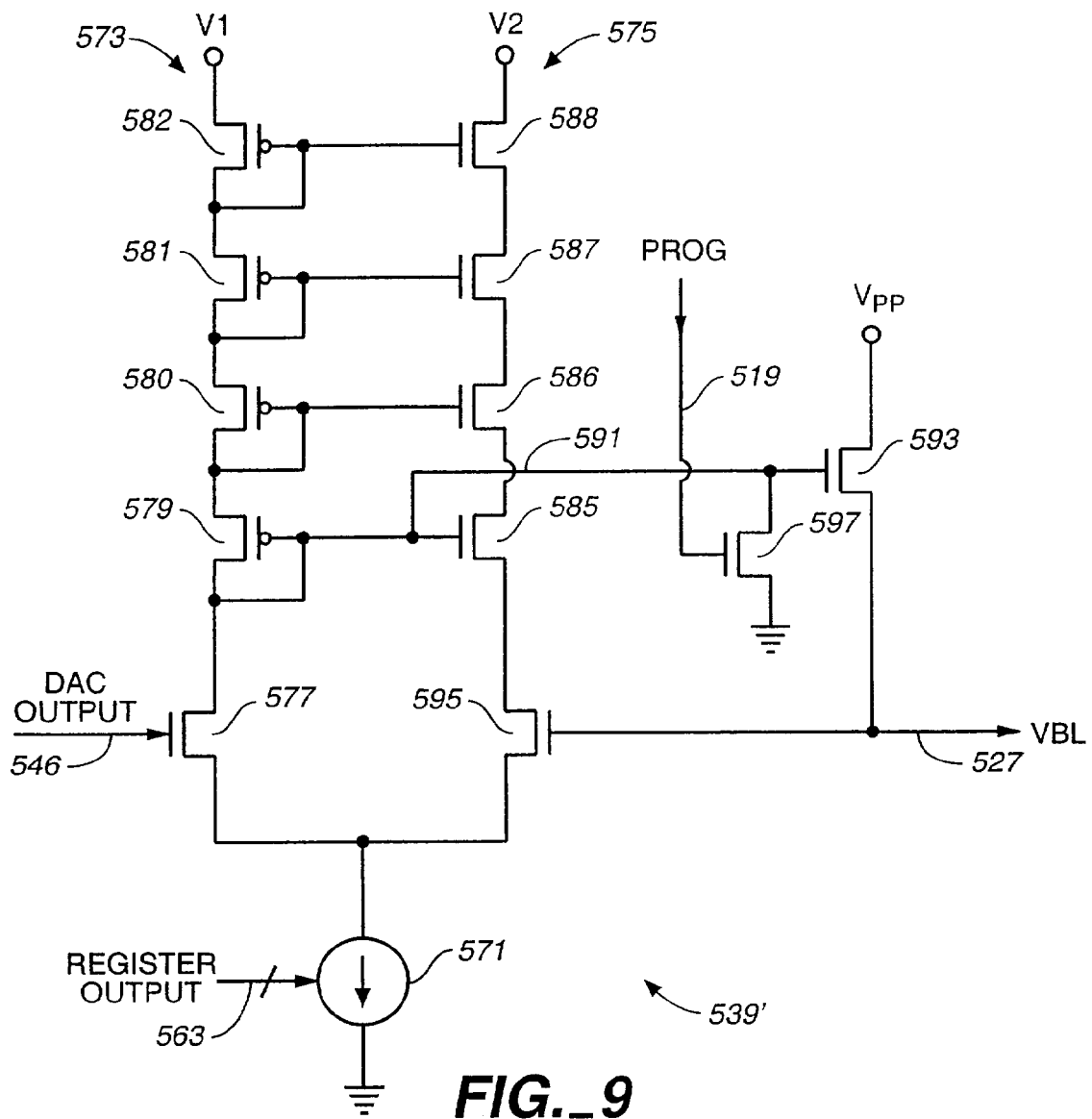
FIG. 9 is an example circuit diagram for the voltage generator block of FIG. 7.

It has been discovered that disturbs are introduced into a memory array due to displacement currents in non-selected word lines resulting from the rate of change in the voltage levels on the bit lines. Returning to the simplified situation of FIG. 1, consider the case where the cell connected between bit lines 111 and 112, with its control gate connected to word line 122, is to be programmed. The bit line 111 will be raised to a voltage Vbl of, say, 5 volts relative to bit line 112. The voltage change on bit line 111 will occur over a finite rise time and is characterized by the rate dVbl/dt. Other cells along the selected word line 122 which are being programmed will similarly have their bit lines raised. The word line 122 is then pulsed with a programming voltage, a verification usually being performed between programming pulses. For the non-selected word lines, such as 121, where the cells are not being programmed, a word line driver such as 131 sets these word lines to ground. Due to the structure of the memory array, each of the word lines 120 is capacitively coupled to each of the bit lines 110. This is shown in the detail by the ghosted capacitor 151 coupling bit line 111 to word line 121. When the voltage Vbl is changed in a given length of time, this results in a displacement current, Idis, on the word line which is proportional to the strength of the capacitive coupling between the word line and the bit line, Cw-b, and proportional to rate at which the voltage on the bit line is changed. As this effect will occur for each of the N bit lines being changed, where N is the number of cells being simultaneously programmed along the word line, the total displacement current into the word line will be approximately Idis~NCw-b(dVbl/dt), where for this simplified discussion, all of the bit lines being changed are taken to have the same coupling and same rise rate.

Since the level of the bit lines 110 are regularly being changed, not just for programming, but also during read, verify, and erase operations, such displacement currents are frequently induced on the non-selected word lines. As already noted, to avoid programming the cells along the non-selected word lines, these word lines are held at ground, so that even though a potential is place across the source and drain of the cell, no programming will occur. Since a word line driver such as 131 is pulling its non-selected word line to ground, this should, ideally, instantly remove the Idis induced by the bit lines. However, the word lines are generally constructed of a poly-crystalline silicon layer having some resistance, with various process considerations limiting how much the conductance of this layer can be improved. Consequently, the displacement current is not immediately dissipated, with the effect becoming more significant for cells on bit lines further removed from the driver.

The result is that some current will be flowing in non-selected word lines and, therefore, will generate a voltage, due to the word line resistance, impressed on the control gates of the floating gate transistors, such as 141. Although this current is transitory, it will still result in a voltage pulse on the control gate. If, additionally, a cell in the same column as transistor 141 is being programmed, the bit lines 111 and 112 will have a voltage drop created between them. The displacement current may then act as a programming pulse and change the amount of chance on the floating gate of transistor 141. Although the strength of this pulse will be less than that applied to a cell in the selected word line, it may still alter the cell's threshold, Vth. Since this effect occurs, to a greater or lesser degree, on the non-selected word lines whenever the levels of the bit lines are changed, the cumulative effect after multiple writes to selected word lines can degrade the integrity of the data stored in the cells of non-selected word lines. This is particularly troublesome in multi-state memories where the difference in threshold value that distinguishes between states can be small. In a cell such as that shown in FIG. 1, which contains a select transistor 142 in addition to the floating gate transistor 141, the select transistor 142 can provide some protection against the cell turning on. However, if the voltage due to the induced current becomes great enough, the intrinsic threshold voltage of the select transistor 142 may eventually be exceeded and result in a disturb—and enough disturbs will lead to an error if they are left unscrubbed.

Therefore, it is desirable to reduce the magnitude of the described displacement current as much as possible. Reducing any of the terms in the expression for Id is will help to ameliorate this effect. Although it is also good to reduce the coupling capacitance Cw-b for other reasons as well, the amount to which this can be done is often limited. As with the word line resistance, the value of this coupling is limited by process considerations—and has, in any case, usually already been minimized nearly as much as is practical within the chosen architecture. Consequently, the following will instead concentrate on reducing the other two factors, namely the number of bit lines N which are inducing these currents at a given time and rate dVbl/dt at which the level of the bit lines are being changed. These factors will be discussed with respect to the exemplary embodiment found in FIGS. 2 and 3 as this particular architecture can result in the sort of relatively long word lines that aggravate the consequences of these induced currents.

Reducing the Number of Bit Lines Coupled with a Word Line

FIG. 2 provides a diagram of the major components of a non-volatile memory system. Only the portions of FIGS. 2 and 3 that are relevant to the present discussion will be described here. More detail can be found in U.S. patent application Ser. No. 09/505,555, filed Feb. 17, 2000, by Kevin M. Conley, John S. Mangan, and Jeffery G. Craig, entitled "Flash EEPROM System with Simultaneous Multiple Data Sector Programming and Storage of Physical Block Characteristics in Other Designated Blocks" which is hereby expressly incorporated herein by this reference and from which FIGS. 2 and 3 are adapted.

The non-volatile memory chip 17 includes a logic circuit 39 for interfacing with the controller through the lines 15. Additional components of the memory chip are not shown for simplicity in explanation. The purpose of the logic circuit 39 is to generate signals in separate buses and control lines. Various control signals are provided in lines 41 and a power supply 43 to the memory array circuits is also controlled through the interface 39. A data bus 45 carries user data being programmed into or read from the non-volatile memory, and an address bus 47 carries the addresses of the portion of the memory being accessed for reading user data, writing user data, or erasing blocks of memory cells.

The floating gate memory cell array of a single non-volatile memory chip is itself divided into a number of units that each have its own set of supporting circuits for addressing, decoding, reading and the like. In this example, eight such array units 0-7, denoted by reference numbers 51-58, are illustrated. Physically, as an example, the memory array on a single chip is divided into quadrants, or "planes", each quadrant including two units that are in part connected together and share a common word line decoding circuits (y-decode), such as the y-decoders 61 and 62 on either side of memory cell units 4 (55) and 5 (56). The common word lines run across both memory cell units 4 (55) and 5 (56), with half connected to the y-decoder 61 on one side and half connected to y-decoder 62 on the other side, as described further below, with respect to FIG. 3. This memory architecture is similar to that described in U.S. Pat. No. 5,890,192, which is hereby expressly incorporated herein by this reference, except there are eight units instead of the four units (quads) illustrated in that patent.

Each of the array units has a bit line decoder (x-decode), such as x-decoder 63 connected to the array unit 5 (56), through which user data is read. FIG. 3 is an expanded view of the array unit 5 and its decoders 61, 62 and 63 that respond to addresses on the address bus 47. Connected to the decoder 63 is a circuit 65 that contains sense amplifiers for reading data, a register for storing data being programmed, comparators used during programming to determine whether addressed cells in the unit 5 have been programmed to the desired state and during reading to determine the states of the cells being read, and control logic to carry out these functions. Two registers 67 and 69 are connected for parallel transfer of user data between them during reading (from 67 to 69) and programming (from 69 to 67). User data is transferred from the data bus 45 and the register 69, one byte at a time, during writing and in the other direction during reading. Each of the other seven array units is similarly connected.

Referring specifically to FIG. 3, a portion of an example memory cell array is generally described with respect to the array unit 5. Each row of cells has its own conductive word line (WL) connected either to the decoder 61, through the corresponding word lines of the adjacent array unit 4, or directly to the decoder 62, in which case the word line continues on to the adjacent array unit 4. Each of two partial rows 70 and 76 of respective floating gate memory cells 71-75 and 77-81, for example, has its own respective word line 83 and 85. In this example, both of the word lines 83 and 85 are connected to the decoder 61. Deciding which decoder is connected to given word line is largely a matter of layout consideration, with the particular architecture shown here as one example. A word line is connected to a gate of each of the cells in a single row, the connected gate being a select gate in a memory cell having a split channel type of structure. Other memory cell structures can be used instead, each having at least one electrically floating gate upon which a level of stored charge is a measure of the state of the cell. A conductive erase line is provided between every other row of memory cells, the line 87 being connected to erase gates of each of the memory cells of each of the rows 70 and 76. The erase gate was suppressed in the detail of FIG. 1 to simplify the discussion there. Alternate structures do not erase the floating gates to a separate erase gate but rather erase to a region of the substrate such as the cell source diffusions. Bit lines (BL) extend in an orthogonal direction to the word lines, one bit line between each column of array cells, and are connected to the decoder 63. Each bit line is connected to the source and drain diffusions of each of the cells of the columns on either side of the bit line. Detailed examples of suitable memory arrays are described in the U.S. patents listed in the Background section above but other existing and proposed structures can alternatively be employed in implementations of the present invention.

A block of cells is formed, in the array example being described, from each pair of rows that surround an erase gate, such as the rows 70 and 76 of the array unit 5 (FIG. 3) on either side of the erase gate 87, when operating each floating gate in four defined threshold voltage states in order to store two bits of data per floating gate.

In the structure shown in FIGS. 2 and 3, a single word line spans both of the memory cell units in a quadrant or "plain". For example, the common word line 85 in FIG. 3 runs across both memory cell units 4 and 5 (55 and 56, respectively, of FIG. 2) to connect to decoder 61. Similarly, word lines connected to decoder 62, such as 89, also run the length of both units. This structure results in relatively long word lines that are more susceptible to the problem of induced current as described above. For example, if cell 75 is to be programmed, the bit lines on either side will have their level set so that the proper amount of voltage is dropped across the cell. This voltage will also be placed across cell 81 and all of the other cells in this column. Word line 83 is then pulsed to program the cell along the row to which it is connected. As word line 85 is a non-selected word line, is will be pulled to ground by decoder 61. However, when the bit lines are raised to program cell 75 (and any other cells being programmed along word line 83), a displacement current is generated resulting in a voltage also being developed at the control gate of cell 81. Although this word line is being driven to ground, this occurs in decoder 61 at a distance away from the end cells, such as cell 75. Given the non-zero resistance of the word lines and that the decoder can be up to the span of two arrays away, this voltage may be significant enough to alter the threshold voltage of cell 81 during the programming of other word lines, such as 83. As a number of cells are programmed together on a word line, and a corresponding number of bit lines have their levels altered, this problem is accordingly amplified.

As described in U.S. patent application Ser. No. 09/505,555 that was incorporated by reference above, when information is to be programmed into the memory structure of FIGS. 2 and 3, it is loaded from the host into the data buffer memory 35. From there it transferred to the memory chip through the controller interface and into the master and slave registers. This transfer of information to the memory chip can be done in serial fashion, transferring, for example, a byte at a time along the bus 15 and into the memory chip. Once the information is loaded into the appropriate slave register, it can then be programmed into the respective array unit.

Data is programmed into the array units a "chunk" at time, where, for example, if every fourth memory cell along a word line is programmed in parallel, a chunk of data would correspond to a quarter of the amount of data which can be stored by the total number of cells along this word line in the array unit. The structure of FIG. 2 allows multiple array units to be programmed in parallel to increase speed. In that particular embodiment, a chunk consists of 66 bytes. Because of the slave registers, the chunk of data to be programmed for each of these arrays can be transferred while the program pulse is active. Once a chunk of data is loaded into the respective slave registers for these units, the parallel programming is performed. As also described in this cited application, rather than transfer an entire chunk of data for each of the individual units contiguously in a (byte-wise) serial manner, in an alternate method the chunks for several arrays are sliced up into byte sized pieces, interleaved, transferred in this order to the appropriated array registers, and reassembled into chunks there prior to the parallel programming. For example, if, say, four array units are to be programmed in parallel, the data can be transferred so that every fourth byte in the stream corresponds to a byte of data from a chunk to be programmed into a particular array.

If, however, two array units from the same quadrant are programmed in parallel, this results in twice the number of bit lines crossing a word line in that quadrant having their levels changed and, consequently, roughly twice the amount of unwanted displacement current being generated in the non-selected word lines. This effect can be reduced if the system avoids the simultaneous programming of array units that share word lines. For example, if the units are programmed in pairs, pairs in the same quadrant should be avoided. If four units are programmed simultaneously, these should each be from a different quadrant. So although performing the parallel programming of adjoining units in the same quadrant may have advantages, such as simplified addressing, to reduce the amount of displacement current and the resultant program disturbs one aspect of the present invention restricts the parallel programming of memory units to those which do not share common word lines.

One way to effect this parallel programming of N units is to establish an ordering of the units, establish a first unit to be written to, and then write the first unit and (N−1) subsequent units in the ordering. The following write will then be performed on the next N units in the ordering, which loops around to the beginning of the order when the end is reached. This can be implemented in a number of ways, such as in the device's firmware by doing a logical re-ordering of the write sequence. For example, the order 02461357 could replace the order 01234567 as found in the prior art. Then if four units were to be written in parallel, and the pointer for the next write was at unit 4, 6, 1, and 3, would be written together, followed by units 5, 7, 0, and 2 being programmed as the next group.

This logical reordering of the write ordering can be stored, for example, in the reserved sector of unit 0, much as the bad column pointers and other chip information is stored, as described more fully in U.S. patent application Ser. No. 09/505,555. In this exemplary embodiment as described so far, with eight units arranged into four pairs, the maximum number of units that can be written in parallel while avoiding units with shared word lines is four. So far, the discussion has implicitly assumed that all of the units are being used. However, the described embodiment also has provisions for removing defective array units from use. For example, if unit 4 were bad, the firmware could delete this unit from the list of usable units, the result being that the write order becomes 0261357-. Thus, if the units were being written in parallel groups of fours, and the current write pointer were at, say, unit 7, units 7, 0, 2, and 6 would be written together resulting in a simultaneous programming two units with shared word lines (6 and 7). A further aspect of the present invention can remove this possibility.

Even with the described logical reordering of the write order, if the device of FIG. 2 is set, either by the user or the manufacturer, to program four units in parallel, whenever a unit is removed from the programming order the possibility of simultaneous writes in both units of a quadrant results. Even if the number of units programmed in parallel is set to two, this situation can arise if enough units are removed. To avoid this, the particular arrays being programmed in a multi-array write are checked to see it such a conflict results, in which case the offending units are written sequentially. In the above example, where the write order is 0261357—and four units are written in parallel, if the pointer for the next write is at 3, then the group written would be 3, 5, 7, and 0: As these are all in separate quadrants, there is no conflict and parallel write can be carried out. If the next write pointer is instead at 7, the parallel write of 7, 0, 2, and 6 produces a conflict between units 6 and 7: To avoid this, units 7, 0, and 2 can be written in together, followed by a write in unit 6. There are a number of ways to implement this conflict check, one example being to have the firmware do a pair by pair comparison of the selected units. This could be done by checking whether the more significant bits of the addresses, which would be shared by units in the same quadrant, coincide.

FIG. 4 shows a simplified flow chart of how the process for avoiding simultaneous writes to units with shared word lines can be accomplished, and can be implemented through the firmware or other techniques. In step 401, the starting unit and number of sectors to be programmed are designated. The starting unit may be some default value or determined based on the unit where the previous programming had stopped. The number of sectors to be programmed may either set by the manufacturer or the user. In step 403 the programming sequence is read, such as the above examples of 02461357 or 0261357—. In the exemplary embodiment of FIG. 2, the information for both of steps 401 and 403 could be kept in the reserved sector of unit 0.

In step 405 the selected sectors are compared to see if any share common word lines. In the embodiment of FIG. 2, this would correspond to two arrays lying in the same quadrant. More generally, units that share word lines can be referred to as a plane, since a generic embodiment may have more than four such planes and each plane may be composed of more than a pair of units. This comparison can be done pair-wise by the firmware based on addresses. If there are no conflicting sectors, all of the selected sectors can be programmed at the same time (step 407). If there is a conflict, step 408 will instead program any conflicting units in sequence.

Once this particular round of programming is finished, step 409 checks to if there are additional units still to be programmed. If not, this particular program cycle ends (step 413); if so, the starting unit is advanced (step 411) by the number of sectors programmed and the process is repeated.

Although the invention has so far been described largely with respect to the particular embodiment of FIGS. 2 and 3, the process of FIG. 4 readily extends to a general situation.

Whenever an array of non-volatile cells is arranged into a number of sub-units that can be programmed in parallel, and when some of these sub-units have common word lines, this procedure can avoid the simultaneous writing of the sub-units sharing word lines, consequently resulting in less induced current in these word lines and a reduction in program disturbs.

Controlling the Rate of Change of Bit Line Voltage

As discussed above, the magnitude of the displacement current induced on the non-selected word lines depends on several factors. The aspects of the present invention described so far have dealt with reducing the number of bit lines contributing to this current. Another aspect is related to reducing the contribution from each of the individual word lines. As the number of bit lines crossing a non-selected word line and the rate at which the level in these bit lines are set are independent, these two aspects of the present invention are complementary and can be used either alone and independently, or else together. Although these aspects of the invention are described with respect to disturbs resulting from programming, they can also be used for reading and other processes where selected word lines are accessed and bit lines are raised since these bit line level changes can again induce a displacement current in word lines.

The displacement current generated by a bit line BL in a non-selected word line is proportional to the rate at which the voltage on the bit lines, Vb1, is set when moving from one voltage to another by the drivers in the x-decoders: Idis~dVbl/dt. Generally, the more quickly the levels on the bit lines can be set, the faster the device. Since device speed is an important factor in many applications, the tendency is to set these levels as quickly as is practically obtainable. However, a direct consequence is an increase in the displacement current and, depending on its magnitude, an increase in program disturbs. Therefore, in some applications or operating conditions a compromise between these competing demands may be needed.

Even within a particular device, the value chosen for the rate dVbl/dt may vary. In the embodiment of FIG. 2 as described in U.S. patent application Ser. No. 09/505,555, the device may be operated based on either a 2-state memory cell (binary) or as a multi-state memory cell (more than two programmable states). If the device is selected to operate by storing, say, four states per cell, the available window of threshold values will be divided more finely and, consequently, more susceptible to disturbs. Thus, it may be that a value of dVbl/dt that is acceptable when operating in binary mode may not be acceptable when the same device is operated as a multi-state memory. Operating conditions, such as temperature or device wear due to write cycling, may also need to be considered as the optimal rise rate Vb1 may depend on these as well. By allowing the rate at which the bit line voltage levels are set by the bit line drivers to be altered, the device's operation can be optimized to its application and operating conditions.

This can be accomplished in several ways. The initial value for the rate can be set to either a default value or one selected by the controller based upon the application or operating characteristics. The system could then monitor the amount of program disturbs and adjust the rate in response. For example, this could be done in the controller and tied in with ECC or other error correction, so that when the amount of disturbs exceeds a bound, the rate could be altered. The rate could also be adjusted periodically based on device cycling or using the "hot count" which keeps track of the number of write cycle done. This periodic adjustment is similar to the "erase reacquire" mechanism used to compensate for sector wear and temperature change, where a new optimum erase voltage is periodically determined for a sector. This mechanism is discussed more fully in U.S. Pat. No. 5,396,468, which is assigned to SanDisk Corporation and which is hereby incorporated herein by this reference, where FIGS. 15a, 15b, and 15c and their associated discussion describe an embodiment in detail.

Alternately, the rise time could be adjusted by the manufacturer based on either performance requirements or amount of resultant error, either directly or as a function of some other parameter, such as the number of states stored per cell, the temperature, or other operating conditions. The rate could be adjusted based upon a parameter stored in the reserved sector of a unit. The value of the parameter would then be set at the factory based on memory tests as well as the device's particular application. Since the optimal rise rate will often depend on the manufacturing process used at a given factory, this allows the parameter to be adjusted for different foundries and also for process variations within a single foundry.

As background to providing a circuit embodiment where the bit line voltage ramp rate is controllable, a typical circuit driving bit lines without such control is shown in FIGS. 5 and 6. Such a circuit can be used in the system of FIGS. 2 and 3, and others. The ramp rate of a voltage rise when a bit line is turned on is primarily dependent upon the resistance of the line and its capacitive coupling with ground and other elements of the memory array. The bit lines are typically formed as ion implanted regions in the substrate, serving as source and/or drain regions for the memory cells. These implants are then connected to global bit lines made of a material with higher conductivity, such as metal, in an upper layer. Since the bit line capacitive coupling is usually quite low, the voltage ramp rate (dVbl/dt) is high when a bit line is suddenly connected to a voltage supply. One way to reduce this ramp rate is to add capacitance to an output of the bit line drivers but this requires significant amounts of circuit area and is somewhat difficult to control in a consistent manner. What this aspect of the present invention accomplishes is the reduction of the rise time of the bit line drivers in a controlled manner. But before explaining this aspect of the invention further, a background exemplary circuit of FIG. 5 and its operating timing diagram of FIG. 6 are described.

Two bit lines 503 and 505 of a memory cell array (not shown in FIG. 5) are each connected through an individual series of transistors to a system voltage supply $V_{PP}$. These can be local bit lines, such as ion implanted strips in the substrate, that are part of the array, or can be global bit lines, usually formed of a metal, that are in turn connected to local bit lines. Long local bit lines are often segmented along their lengths, with the individual segments connectable to global bit lines through switching transistor circuits.

A bit line transistor series circuit connected between a power supply and memory array bit lines 503 and 505 is first described. A first transistor 511 has its drain and gate connected to the voltage supply $V_{PP}$ to act as a resistor. A second transistor 513 has its gate connected to a level shifter 518 and data latch 515 to be turned on during the programming of data into the array when both a program enable (PROG) signal 519 is active and data exists in the latch 515 to which a cell in the bit line 505 is to be programmed. A third transistor 521 has its gate connected to an output of a comparator 523 that is also connected to the bit lines 503 and 505 through respective lines 524 and 525. The purpose of the comparator 523 is to maintain the voltage $G_{BL}$ of a selected one of the bit lines 503 and 505 with a fixed relationship (such as equal) to a bit line voltage supply $V_{BL}$ applied to an input 527 of the comparator.

This is done in a feedback circuit that drives the third transistor 521 to a level of conduction that provides the desired bit line voltage $G_{BL}$.

A fourth transistor 528 in series with the bit line 503 has its gate connected through a line 530 to an output of a Y-decoder 533 that enables one of multiple output lines 535 in response to a particular address in a local address bus 537. Similarly, a fourth series transistor 529 is connected to the bit line 505, with its gate connected by a line 531 to the Y-decoder 533. Only one of the two bit lines is enabled at one time, depending upon which of the transistors 528 and 529 is rendered conductive by being addressed through the decoder 533.

A voltage generator 539 generates a value of $V_{BL}$ specified by an input analog voltage 541 output of a digital-to-analog converter (DAC) 543. A digital voltage value 545 specified by a controller 547 of the memory system is loaded into a register 544 which serves as an input to the DAC 543. This sets the voltage $V_{BL}$, and thus the voltage $G_{BL}$. In application, the pair of bit lines 503 and 505 can be repeated one or more times in an array or sub-array of memory cells, each pair having its own series transistor circuit connecting the bit lines to $V_{PP}$, as well as its own level shifter, comparator and Y-decoder. All such other bit line pairs are, however, driven by the same $V_{BL}$ output of the voltage generator 539.

When the bit lines 503 and 505 are global bit lines, the global bit line 503 can be made connectable through a segment selection circuit to two or more local bit lines (not shown). Similarly, the global bit line 505 can be made connectable through another segment selection circuit to two or more additional local bit lines.

The timing diagram of FIG. 6 shows example occurrences of three voltages in the circuit of FIG. 5 during a typical programming operation. When the memory system is first powered-up at time t0, such as, if in the form of a card, the memory card is inserted into a receptacle of the host, the voltage generator 539 (FIG. 5) begins to generate the voltage $V_{BL}$ and continues to do so for as long as power is supplied to the system. There is a natural rise time 550 when the voltage $V_{BL}$ is turned on, due to the characteristics of the voltage generator 539, but this is not passed on to the memory array since it occurs without the PROG signal 519 going active. When the controller 547 later issues a program enable signal PROG 519 at time t1, the second transistor in each of the global bit line series circuits is rendered conductive. The voltage $V_{BL}$ then causes the voltage $G_{BL}$ to occur in one of the bit lines 503, 505, 507 or 509 that is selected by the y-decoder 533. Since the PROG enable pulse has a fast rise time 551, the $G_{BL}$ applied to the bit lines has a rise time 553 determined by the resistive-capacitive characteristics of the bit lines being driven. It is the resulting fast rise time 553 that causes voltages to be induced in the non-selected word lines that cross the bit lines receiving the $G_{BL}$.

With reference to FIGS. 7 and 8, changes in the bit line driving circuits of FIG. 5 are shown which allow the $G_{BL}$ pulse rise time to be controlled in order to reduce the level of voltage induced in the word lines. Rather than maintaining the voltage $V_{BL}$ active all the time and then gating it into bit lines by the PROG enable signal, a modified voltage generator 539' and comparator 523' are gated by a leading edge 555 of the PROG enable signal 519 at time t1 to generate a $V_{BL}$ pulse having a rise time 557 at that time. The voltage $G_{BL}$ applied to the selected bit lines also has the controlled rise time 559 at time t1. That rise time is controlled by the voltage generator 539', rather than being the sole result of the resistance and capacitance of the bit lines and/or of the lines and transistors driven by the output of the comparator 523.

In a basic application, the characteristics of the voltage generator 539 of FIG. 5 need not be changed. It's natural rise time 550 (FIG. 6) can be utilized by turning on the voltage generator 539 with the PROG signal 519 to commence a program operation, as shown in FIG. 7, rather than leaving it on all the time during operation of the memory system, as shown in FIG. 6. However, it is usually preferable to be able to control that rise time. In the embodiment shown in FIGS. 7 and 8, the rate of the voltage rise 557 is controlled by the contents of a register 561 that applies its contents over lines 563 to the voltage generator 539' The register 561 is one bit if it is desired to select from only two different values of dVb1/dt, two bits for four different values of this rise time, and so forth. The register can be permanently programmed if it includes one-time programmable random-access-memory (ROM) cells, such as those having fuse elements. The rise time may be made to be permanently selectable only by the manufacturer, for example, if one-time programmable elements are used. The rise time can be set for each memory array circuit chip in response to tests of the chip that are part of the manufacturing process. Alternatively, the register 561 can include volatile memory cells that store data inputted at 565. This data can be input, for example, from a field within a reserved sector of data stored in the non-volatile memory array each time the memory system is powered up. This field can be changed by the memory controller, for example, from outside of the memory array circuit chip, wherein the user or host system can make changes over the life of the memory in response to changes in its characteristics or use. Alternatively, this reserved sector field can be written by the controller from data generated within the chip to automatically adapt to changes in its performance, characteristics or use, as previously discussed. The register 561 can alternatively be non-volatile re-programmable memory that is programmed by the controller or an external source but this is not usually preferred.

A circuit diagram of the principal components of one example of the voltage generator 539' is shown in FIG. 9. A current source 571 is controllable by the contents of the ramp rate control register 561. In one form, the current source 571 contains a number of parallel sources of different levels of current, one being selected by the bit value of the ramp rate control register output 563. The current source 571 is connected in series with parallel chains of transistors 573 and 575. A transistor 577, connected in the chain 573, receives the analog output 546 of the DAC 543 (FIG. 5). Remaining transistors 579-582 in the chain 573 serve as source transistors of a current mirror circuit. Transistors 585-588 of the chain 575 are the receiving transistors of the current mirror. The gates of the transistors 579-582 are individually connected to the gates of the transistors 579-582, respectively.

An output 591 of the mirroring circuit is connected to a gate of a transistor 593 that is connected between the voltage supply Vpp and the output 527 of the voltage $V_{BL}$. This output voltage is also connected to a gate of a transistor 595 that is part of the chain 575, as a voltage regulating feedback. Another transistor 597, connected between the output line 591 and ground, has its gate connected to the PROG control signal in line 519. The transistor 597 keeps the output $V_{BL}$ at a standby level, such as zero volts, until the PROG command is received. Once PROG is received, $V_{BL}$ starts ramping up with a ramp rate 557 that is dependent upon the level of current selected for the current source 571 by the bits in the lines 563 from the register 561 (FIG. 7). A low current from the source 571 gives a slow ramp rate, while a high current gives a high ramp rate. The comparator 523' makes sure that the voltage $G_{BL}$ applied to a selected bit line equals $V_{BL}$ and has the same ramp rate.

Although the various aspects of the present invention have been described with respect to specific exemplary embodiments, it will be understood that the invention is entitled to protection within the full scope of the appended claims.

It is claimed:

1. A non-volatile memory device, comprising:
   a plurality of word lines;
   a plurality of bit lines;
   a plurality of non-volatile memory cells each connected to a corresponding bit line and a corresponding word line, wherein information is stored in a selected one of the memory cells by applying a first voltage to the corresponding word line to which the selected cell is connected and a second voltage to the corresponding bit line to which the selected cell is connected;
   a switch whereby the second voltage is provided to the bit line corresponding to the selected cell; and
   a voltage generator circuit connected to received a program enable signal and provide to the switch for the control thereof a voltage gated by the leading edge of the program enable signal, whereby the ramp rate of the second voltage is controlled by the ramp rate of the voltage gated by the leading edge of the program enable signal.

2. The non-volatile memory device of claim 1, further comprising:
   a register connected to the voltage generator circuit, whereby the ramp rate of the voltage gated by the leading edge of the program enable signal is dependent upon the register content.

3. The non-volatile memory device of claim 2, wherein the register content is held in one-time programmable memory.

4. The non-volatile memory device of claim 2, wherein the register content is held in reprogrammable memory.

5. The non-volatile memory device of claim 4, wherein the register content is externally adjustable.

6. The non-volatile memory device of claim 4, further comprising: a controller, wherein the register content is adjustable by the controller.

7. The non-volatile memory device of claim 2, wherein the voltage generator circuit includes a current source whose level is controllable by the register content, thereby to control the ramp rate of the voltage gated by the leading edge of the program enable signal.

* * * * *

UNITED STATES PATENT AND TRADEMARK OFFICE
CERTIFICATE OF CORRECTION

PATENT NO. : 7,468,915 B2  
APPLICATION NO. : 11/538521  
DATED : December 23, 2008  
INVENTOR(S) : Guterman et al.

Page 1 of 1

It is certified that error appears in the above-identified patent and that said Letters Patent is hereby corrected as shown below:

Column 13, line 21, please delete "received" and insert -- receive --.

Signed and Sealed this

Twenty-fourth Day of February, 2009

JOHN DOLL  
*Acting Director of the United States Patent and Trademark Office*